United States Patent

Loya

Patent Number: 5,168,527
Date of Patent: Dec. 1, 1992

[54] MINIATURE SPEAKER VARIABLE STANDOFF MOUNT

[75] Inventor: Rami Loya, Rockville, Md.

[73] Assignee: LZR Electronics, Inc., Gaithersburg, Md.

[21] Appl. No.: 827,871

[22] Filed: Jan. 30, 1992

Related U.S. Application Data

[63] Continuation of Ser. No. 537,663, Jun. 14, 1990, abandoned.

[51] Int. Cl.⁵ .................... H04R 1/02; H04R 25/00
[52] U.S. Cl. ................... 381/188; 381/87/205
[58] Field of Search ............... 381/87, 114, 150, 168, 381/169, 188, 193, 205; 181/141

[56] References Cited

U.S. PATENT DOCUMENTS

| | | | |
|---|---|---|---|
| 4,354,067 | 10/1982 | Yamada et al. | 381/158 |
| 4,420,706 | 12/1983 | Siebold et al. | 381/87 |
| 4,692,942 | 9/1987 | Morgard | 381/114 |
| 4,733,748 | 3/1988 | Ponticelli, Jr. | 181/141 |
| 4,755,975 | 7/1988 | Ito et al. | 381/205 |
| 4,993,510 | 2/1991 | Kato et al. | 181/141 |
| 5,048,089 | 10/1991 | Moore | 381/87 |

FOREIGN PATENT DOCUMENTS 0198359 10/1986 European Pat. Off. ............ 381/159
8400662 2/1984 PCT Int'l Appl. ................. 381/189

OTHER PUBLICATIONS

H. H. Buggie, Incorporated, "Terminal Connector Strip", Apr. 1958.
Atlas/Soundolier, "Indoor/Outdoor Mini-Loudspeakers System", Jan. 1990.
Floyd Bell, Incorporated, "AudioLarm", May 1990.
IBM Corporation, "Speaker Bracket", IBM Technical Disclosure Bulletin vol. 33 #7, Dec. 1990.

Primary Examiner—Curtis Kuntz
Assistant Examiner—William Cumming
Attorney, Agent, or Firm—Longacre & White

[57] ABSTRACT

A miniature loud speaker mounted on a frame, the frame having prongs which fit into holes of a printed circuit board, the prongs having step changes which permit the speaker to be spaced an adjustable distance from the surface of the printed circuit board, and the frame and prongs formed together as one unified structure.

12 Claims, 2 Drawing Sheets

MINIATURE SPEAKER VARIABLE STANDOFF MOUNT

This is a continuation of application Ser. No. 07/537,663, filed Jun. 14, 1990, which was abandoned upon the filing hereof.

BACKGROUND OF THE INVENTION

1. Field of the Invention

The present invention relates to the mounting of miniature speakers to printed circuit boards and more particularly to a miniature speaker mounted on a frame, the frame having stepped prongs to hold the speaker a distance from the printed circuit board.

2. The Prior Art

It is known in the prior art to have miniature speakers connected to printed circuit boards. For example, U.S. Pat. No. 4,420,706 discloses a connector assembly for a Piezoelectric transducer, which uses mounting clips which extend through printed circuit boards. However, there is no provision for the mounting clips to hold the speaker away from the board.

U.S. Pat. No. 4,733,748 discloses a loudspeaker mounting device for a car radio which includes clamp brackets which have serrated tooth portions used to clamp the speaker down and hold it against a resilient pad. However, the purpose of the serrated tooth portions is to hold the speaker tightly flush against the mounting surface, not to hold the speaker away from the mounting surface.

The prior art does not show a device for mounting a miniature speaker to a printed circuit board where the miniature speaker is spaced away from the mounting surface of the printed circuit board, which would allow the placement of other pieces of equipment underneath the speaker (between the speaker and the printed circuit board) as well as keeping the vibrational effects of the speaker away from the other equipment on the printed circuit board. Furthermore, it would be advantageous if the mounting device of the speaker could be manufactured as one part unified with the frame of the speaker.

SUMMARY OF THE INVENTION

It is the primary object of the present invention to overcome the problems of the prior art.

It is a further object of the present invention to provide an improved miniature speaker for mounting onto a printed circuit board.

It is a yet further object of the present invention to provide a mounting device for a miniature speaker which spaces the speaker away from the printed circuit board to which the speaker is mounted.

It is yet another object of the present invention to provide a mounting device for a miniature speaker in which the frame of the speaker is formed as one piece with prongs which can be inserted into a printed circuit board to mount the speaker device.

Another object is to provide a speaker frame constructed with one metal stamping which includes prongs for mounting or which includes prongs for mounting on a circuit board. Such a metalic stamping can also be flush mounted to a circuit board.

The objects and features of the present invention set forth above and other objects and features can best be understood from a detailed description of a preferred embodiment of the invention selected for purposes of illustration and shown in the accompanying drawings:

BRIEF DESCRIPTIONS OF THE DRAWINGS

DETAILED DESCRIPTION OF THE PREFERRED EMBODIMENT

Figure 2:
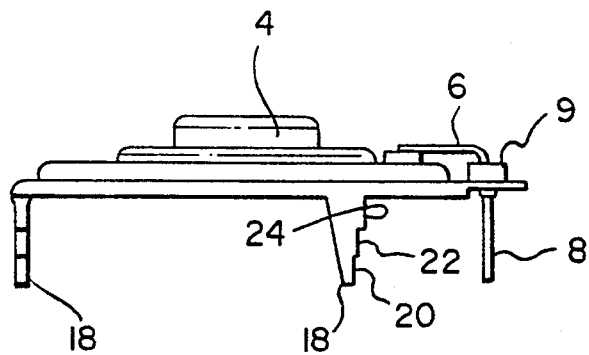
FIG. 2 is a side view of the speaker device of FIG. 1 in accordance with the present invention.

Referring now to the figures, and particularly FIG. 2, a speaker device 2 adapted for mounting onto a printed circuit board as shown. Loudspeaker 4 is electrically connected to a printed circuit board through wiring 6 into conductor wires 8 which electrically mate with connections located on the printed circuit board.

Conductor wires 8 are mounted on the speaker frame by means of insulating bushings 9 which electrically isolate the metal frame from the speaker circuit wiring. The bushings 9 and wires 8 provide a stiff pin like connection to the circuit board.

Loudspeaker 4 is attached to a frame which, in a preferred embodiment, comprises an inner ring member 10, a middle ring member 14, which is attached to inner ring member 10 by means of four connecting members 12, an outer ring member 16, and preferably three mounting prongs 18. Preferably all of the parts of the frame are stamped out of metal as one unified part. The frame may also be a plastic material or ceramic material.

Figure 1:
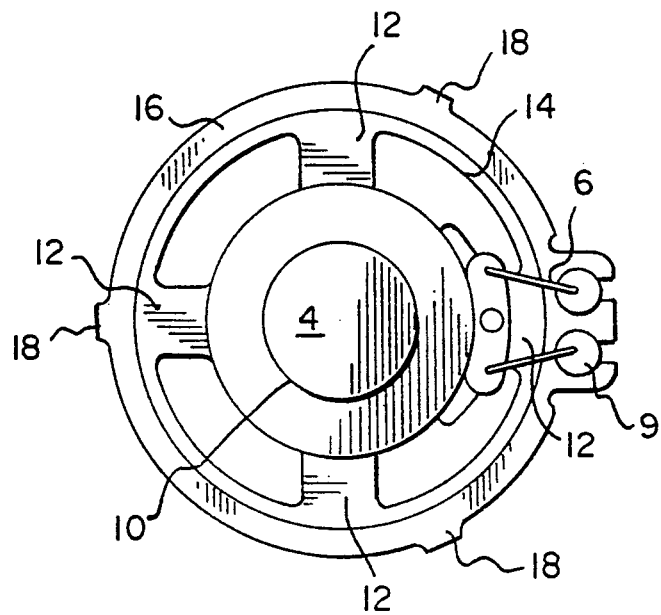
FIG. 1 is a top view of a miniature speaker device for mounting onto a printed circuit board in accordance with the present invention.

As can be seen from FIG. 1, loudspeaker 4 is attached to the inner ring member 10 of the frame, preferably permanently.

The speaker device is secured to the printed circuit board 5 by means of the mounting prongs 18. In a preferred embodiment of the mounting prongs 18, as shown in FIG. 2 and in more detail in FIG. 3, the prong is a stamped flat piece having a tip 20 which has a smaller cross-section than the cross-section of the prong in the area immediately adjacent, which comprises prong middle area 22 which, itself, is smaller in cross section than the cross section of the area of the prong 24 which is immediately adjacent to the speaker frame outer ring 16. Thus, the speaker device has two step changes 26 and 28 along its length. The two step changes 26 and 28 are alternately usable for engaging the mounting surface of the printed circuit board. Thus, if a smaller radius hole 5a in the printed circuit board 5 is used, tip 20 is inserted into the hole and step change surface 26 catches the mounting surface of the printed surface board holding the speaker device 2 in place yet maintaining a spacing between the speaker 4 and the printed circuit board. The space can be filled by other parts as necessary. The spacing also keeps the vibrational effects of the speaker 4 away from the surface of the printed surface board as well as other equipment.

Figure 3:
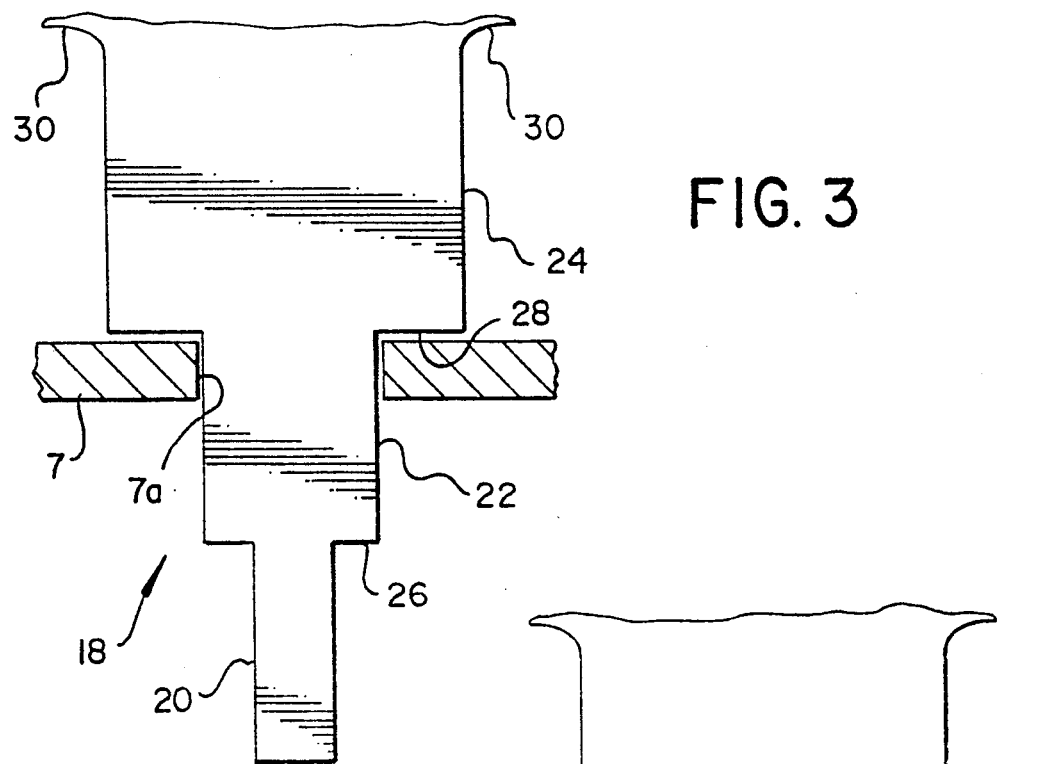
FIG. 3 is an enlarged view of the mounting prongs also shown in FIG. 2 in accordance with the present invention.
Figure 5A:
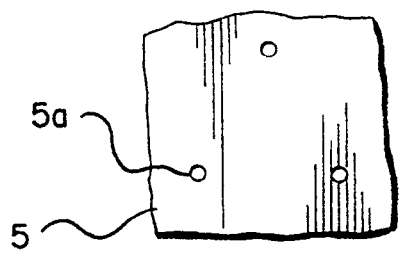
FIG. 5a shows a partial view of a circuit board having small holes.
Figure 5B:
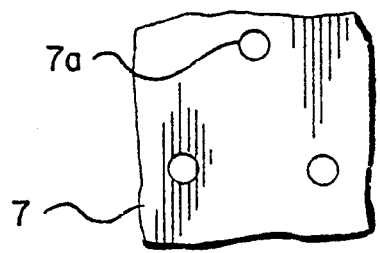
FIG. 5b shows a partial view of a circuit board having large holes.

If a slightly larger hole is used in the printed surface board such as shown in FIG. 5b, both tip 20 and middle section 22 would go through the hole 7a and the prong would be caught at the surface of step change 28 again holding the speaker device 2 in place with a smaller spacing between the speaker 4 and the printed circuit board 7, as shown in FIG. 3. If a slightly larger hole is used in the printed circuit board than tip 20 middle section 22 and larger section 24 will all go through the hole and the frame would be caught at joining surface 30, leaving very little space between the mounting surface of the printed surface board and the loudspeaker 4. Finally, if the board hole is larger, the speaker can be flush mounted.

Loudspeaker 4 preferably comprises a cone of waterproof paper composition or a cone of plastic although any composition could, of course, be used.

Figure 4:
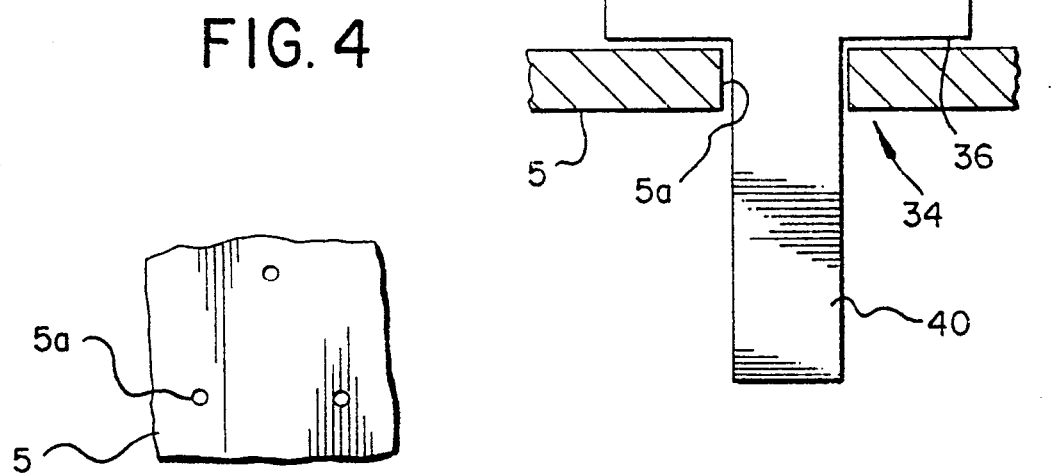
FIG. 4 is another embodiment of a prong for a miniature speaker device for mounting to a printed circuit board in accordance with the present invention.

FIG. 4 shows an alternative embodiment of a prong 34 in accordance with the present invention. In the alternative prong 34, there is only one step change 36 between the tip area 40 and the larger area of the prong 42. The operation of the second embodiment is exactly the same as the first embodiment except that one less hole size in the printed circuit board can be used thus making one less available spacing between the speaker and the printed circuit board possible as shown in FIG. 4.

Of course it is also possible to use more than two-step changes if desired. It is also possible to have the step changes on both sides of the prong as shown in the drawings or only on one side. It is also possible to use, instead of the flat part shown in the drawings, a round prong or a prong of any desired geometric shape.

In this invention at least one prong is shaped from a flat piece of metal and steps are cut into the edges of the metal whereby the prong has a uniform cross-section in one direction and a step in the other.

Still further, in this invention the prong has a step change in cross-section wherein a flat surface created by said step changes engages the face of the PC board.

In this invention, the prongs for mounting the speaker and the support for the conductor wires are co-stamped as a unified structure along with the frame. The frame stamping simultaneously creates the prongs and the support for the conductor wires along with the speaker frame. In this manner, the prongs and the support for the conductor wires are permanently attached to the frame because they are part of the frame.

In FIG. 5a there is shown a PC boar having small size holes for engaging a first section of the two-step prong of the type shown in FIG. 3. In FIG. 5b there is shown a second PC board section which includes larger holes which will accept the next step down as shown in FIG. 3. The next step down is the step indicated at reference numeral 28.

The creation of a three-step prong is generally indicated at FIG. 3 where the surface 30 can be yet a further step in the prong thereby creating a joining surface at surface 30, and steps at surface 28 and surface 26.

The loudspeaker of this invention is formed with the speaker frame during a stamping operation where the speaker frame is formed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A loudspeaker comprising in combination:
a speaker mounted on a frame;
at least one stand off mounting prong secured to said frame, said at least one prong having at least one step change in cross-section located along its length for engaging a hole of preselected size in a mounting surface and suspending said frame a selected distance from said surface by resting said frame against said surface through said at least one step change bearing on an edge of said hole wherein said step change is adapted to resist closer placement of said frame to said surface and selection of a differently sized hole in said mounting surface alters said selected distance; and
wherein said at least one prong is a unified structure with said frame.

2. The loudspeaker of claim 1 wherein said at least one prong comprises a flat piece of metal and said step change is formed in the edges of said metal whereby said at least one prong has a uniform thickness in one direction and a step in the other.

3. The loudspeaker of claim 2 wherein there is a step on opposing sides of said prong.

4. The loudspeaker of claim 1 wherein said prong has a step change in cross-section wherein a flat surface created by said step change engages the face of a PC board.

5. The loudspeaker of claim 1 wherein there are two of said prongs.

6. The loudspeaker of claim 1 wherein there are three of said prongs.

7. The loudspeaker of claim 1 wherein said speaker cone of waterproof paper composition.

8. The loudspeaker of claim 1 wherein said speaker comprises a cone of plastic composition.

9. The loudspeaker of claim 1 wherein said frame and said prong are of plastic composition.

10. The loudspeaker of claim 1 wherein said frame and said prong are metal.

11. A loudspeaker comprising in combination:
a speaker mounted on a frame;
at least one stand off mounting prong secured to said frame, said at least one prong having a plurality of step changes in cross-section located along its length for engaging a mounting surface for supporting said frame;
wherein said step changes are alternately usable for engaging differently sized holes in said mounting surface so as to selectively support said speaker at a plurality of desired distances from said mounting surface.

12. The loudspeaker of claim 11 wherein said prong has at least three step changes.

* * * * *